(12) United States Patent
Moussy et al.

(10) Patent No.: US 12,191,330 B2
(45) Date of Patent: Jan. 7, 2025

(54) IMAGE SENSOR COMPRISING A PLURALITY OF SPAD PHOTODIODES

(71) Applicant: Commissariat à l'Énergie Atomique et aux Énergies Alternatives, Paris (FR)

(72) Inventors: Norbert Moussy, Grenoble (FR); Cédric Giroud-Garampon, Grenoble (FR); Olivier Saxod, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 20 days.

(21) Appl. No.: 18/345,494

(22) Filed: Jun. 30, 2023

(65) Prior Publication Data

US 2023/0343799 A1    Oct. 26, 2023

Related U.S. Application Data

(62) Division of application No. 17/076,732, filed on Oct. 21, 2020, now Pat. No. 11,830,891.

(30) Foreign Application Priority Data

Nov. 26, 2019   (FR) ..................... 1913212

(51) Int. Cl.
*H01L 27/146* (2006.01)
*H01L 31/107* (2006.01)
(52) U.S. Cl.
CPC .... *H01L 27/1461* (2013.01); *H01L 27/14623* (2013.01); *H01L 27/14643* (2013.01); *H01L 31/107* (2013.01)

(58) Field of Classification Search
None
See application file for complete search history.

(56) References Cited

U.S. PATENT DOCUMENTS 10,103,285 B1 * 10/2018 Lo .................. H01L 31/107
2018/0019268 A1    1/2018 Zhang et al.
(Continued)

FOREIGN PATENT DOCUMENTS

EP    2 787 531 A1    10/2014
EP    3 462 497 A1    4/2019
(Continued)

OTHER PUBLICATIONS

Preliminary Search Report for French Application No. 1913212, dated Jul. 13, 2020.

*Primary Examiner* — Nilufa Rahim
(74) *Attorney, Agent, or Firm* — Wolf, Greenfield & Sacks, P.C.

(57) ABSTRACT

An image sensor including a plurality of avalanche photodiodes formed inside and on top of a semiconductor substrate of a first conductivity type having a front side and a back side, wherein: trenches vertically extend in the substrate from its front side to its back side, the trenches having, in top view, the shape of a continuous grid laterally delimiting a plurality of substrate islands, each island defining a pixel including a single individually-controllable avalanche photodiode, and including a doped area of collection of an avalanche signal of the pixel photodiode the lateral walls of the trenches are coated with a first semiconductor layer having a conductivity type opposite to that of the collection area, and a conductive region extends in the trenches, the conductive region being in contact with the surface of the first semiconductor layer opposite to the substrate.

10 Claims, 3 Drawing Sheets

(56) References Cited

U.S. PATENT DOCUMENTS

| | | |
|---|---|---|
| 2019/0198701 A1* | 6/2019 | Moussy .......... H01L 31/022408 |
| 2020/0105958 A1 | 4/2020 | Sasago et al. |
| 2021/0193707 A1 | 6/2021 | Ishida et al. |
| 2022/0190011 A1 | 6/2022 | Yamazaki |
| 2023/0083263 A1 | 3/2023 | Fujiwara et al. |

FOREIGN PATENT DOCUMENTS

| | | |
|---|---|---|
| WO | WO 2018/101033 A1 | 6/2018 |
| WO | WO 2019/216242 A1 | 11/2019 |

* cited by examiner

IMAGE SENSOR COMPRISING A PLURALITY OF SPAD PHOTODIODES

CROSS-REFERENCE TO RELATED APPLICATIONS

This application is a Division of U.S. application Ser. No. 17/076,732, filed Oct. 21, 2020, entitled "IMAGE SENSOR COMPRISING A PLURALITY OF SPAD PHOTODIODES", which claims priority to French patent application number FR1913212, filed Nov. 26, 2019. The contents of these applications are incorporated herein by reference in their entirety.

TECHNICAL BACKGROUND

The present disclosure generally concerns the field of avalanche photodiodes for the detection of single photons, also called SPAD "Single Photon Avalanche Diode") photodiodes. It more particularly aims at an image sensor comprising a plurality of SPAD photodiodes.

PRIOR ART

A SPAD photodiode is essentially formed by a PN junction reverse biased at a voltage greater than its avalanche threshold. When no electric charge is present in the depletion area or space charge area of the PN junction, the photodiode is in a non-conductive pseudo-steady state. When a photo-generated electric charge is injected into the depletion area, if the displacement speed of this charge in the depletion area is sufficiently high, that is, if the electric field in the depletion area is sufficiently intense, the photodiode is capable of avalanching. A single photon is thus capable of generating a measurable electric signal, and this, with a very short response time. SPAD photodiodes enable to detect radiations of very low intensity, and are in particular used for single photon detection and photon counting.

Patent application WO2018050996 previously filed by the applicant describes embodiments of SPAD photodiodes with vertical PN junctions enable to efficiently collect charges photogenerated in depth in the substrate.

The forming of an image sensor comprising a plurality of SPAD photodiodes with vertical PN junctions is here considered.

SUMMARY

An embodiment provides an image sensor comprising a plurality of avalanche photodiodes with a vertical PN junction formed inside and on top of a semiconductor substrate of a first conductivity type having a front side and a back side, wherein:
- trenches vertically extend in the substrate from its front side to its back side, the trenches having, in top view, the shape of a continuous grid and laterally delimiting a plurality of substrate islands (or blocks), each island (or block) defining a pixel comprising a single individually-controllable avalanche photodiode with a vertical PN junction, and comprising a doped area of collection of an avalanche signal of the pixel photodiode;
- the lateral walls of the trenches are coated with a first semiconductor layer having a conductivity type opposite to that of the collection area; and
- a conductive region extends in the trenches, said conductive region being in contact with the surface of the first semiconductor layer opposite to the substrate.

According to an embodiment, the collection areas of the different pixels are electrically insulated from one another.

According to an embodiment, the conductive region is opaque to the radiation to be detected.

According to an embodiment, the conductive region is made of metal.

According to an embodiment, the conductive region comprises copper or tungsten.

According to an embodiment, the first semiconductor layer is made of doped polysilicon.

According to an embodiment, the first semiconductor layer is of the second conductivity type, the junction between the lateral surfaces of each substrate island and the first semiconductor layer defining an avalanche area of an avalanche photodiode of the sensor.

According to an embodiment, the sensor further comprises, in an upper portion of each substrate island, a peripheral ring-shaped region of the second conductivity type having a doping level lower than that of the first semiconductor layer, laterally extending from the lateral walls of the trenches.

According to an embodiment, in each island, the collection area is a region of the same conductivity type as the substrate but of higher doping level, located in a central portion of the island.

According to an embodiment, the sensor further comprises, in a central portion of each substrate island, a central region of the second conductivity type forming the collection area of the island, vertically extending in the substrate from its front side to its back side, the junction between the lateral surfaces of the central region of the second conductivity type and the substrate defining an avalanche area of an avalanche photodiode of the sensor.

According to an embodiment, the first semiconductor layer is of the first conductivity type.

According to an embodiment, the sensor further comprises, in an upper portion of each substrate island, a ring-shaped region of the second conductivity type having a doping level lower than that of the central region of the second conductivity type, laterally extending from the lateral walls of the central region of the second conductivity type.

According to an embodiment, the substrate is topped, on its front side, with a second semiconductor layer of the first conductivity type having a doping level lower than that of the substrate, the trenches crossing the second layer.

According to an embodiment, the substrate rests, on its back side, on a third semiconductor layer of the second conductivity type, the trenches emerging into or onto the third layer or crossing the third layer.

According to an embodiment, the doping level of the third layer is lower than that of the first layer.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the circuits for controlling the SPAD photodiodes of the described sensors, particularly comprising circuits for biasing the PN junctions of the SPAD photodiodes, readout circuits capable of detecting the avalanching of the SPAD photodiodes, as well as quenching circuits having the function of interrupting the avalanches of the SPAD photodiodes once they have started, have not been detailed, the described embodiments being compatible with usual implementations of such circuits or the forming of such circuits being within the abilities of those skilled in the art based on the indications of the present disclosure.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless specified otherwise, it is referred to the orientation of the cross-section views of the drawings.

Unless specified otherwise, the expressions "approximately", "substantially", and "in the order of" signify within 10%, preferably within 5%, or when they concern angles or absolute or relative angular orientations, within 10 degrees, and preferably within 5 degrees.

Figure 1A:
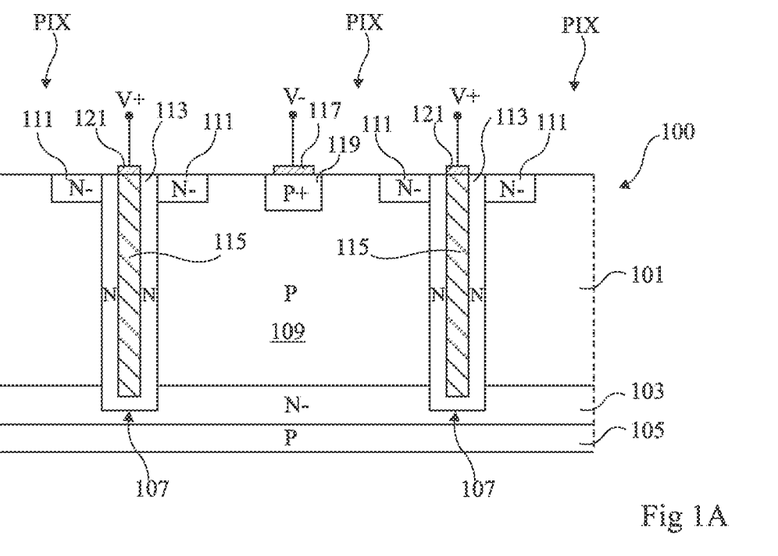
FIG. 1A is a cross-section view illustrating an example of an image sensor according to an embodiment.
Figure 1B:
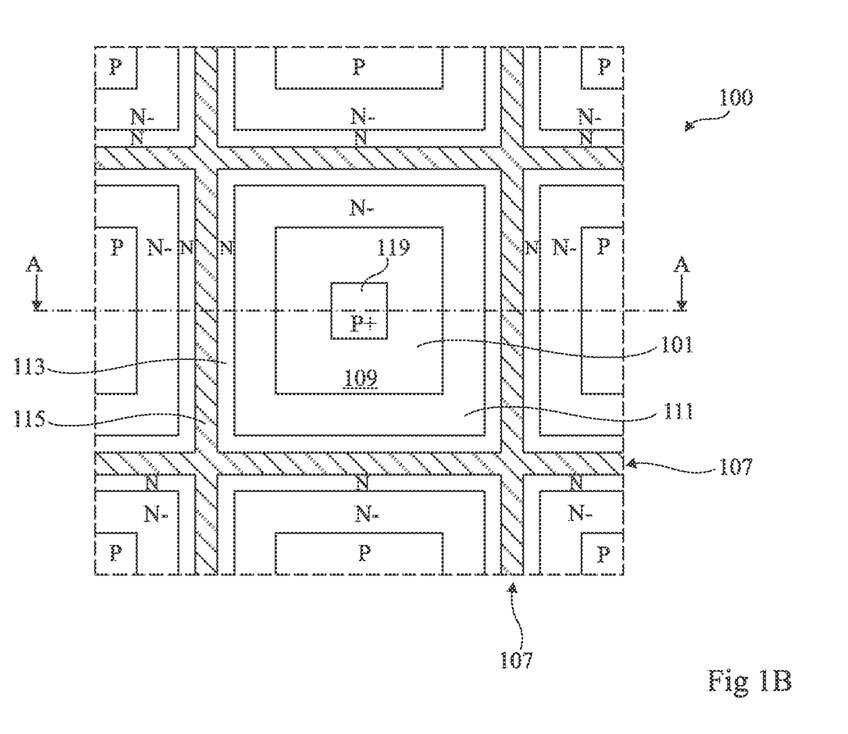
FIG. 1B is a top view of the sensor of FIG. 1A.

FIGS. 1A and 1B schematically and partially show an example of an image sensor 100 according to an embodiment. FIG. 1B is a top view of the sensor and FIG. 1A is a cross-section view along plane A-A of FIG. 1B.

Sensor 100 comprises a plurality of pixels PIX, for example, identical or similar (to within manufacturing dispersions). Each pixel PIX comprises a SPAD photodiode with a vertical PN junction. The different pixels PIX of the sensor are for example individually addressable, that is, that the SPAD photodiode of each pixel PIX may be controlled independently from the SPAD photodiodes of the other pixels PIX.

Sensor 100 comprises a semiconductor substrate 101 having substantially horizontal upper and lower surfaces (in the orientation of FIG. 1A). Substrate 101 may be made of silicon, for example, of single-crystal silicon. In this example, substrate 101 is P-type doped (P). In the shown example, substrate 101 rests on an N-type doped layer 103 (N-), having its upper surface in contact with the lower surface of the substrate.

In this example, layer 103 itself rests on a P-type doped layer 105 having its upper surface in contact with the lower surface of layer 103. As an example, layer 105 may be a support substrate, having layer 103 and then substrate 101 formed by epitaxy on its upper surface. As an example, the thickness of substrate 101 is in the range from 3 to 25 μm. Layer 103 for example has a thickness in the range from 500 nm to 3 μm.

Sensor 100 comprises trenches 107 extending vertically in substrate 101 from its upper surface, or front side, down to its lower surface, or back side. In this example, trenches 107 emerge onto the upper surface of layer 103 or into layer 103. In top view, trenches 107 have the shape of a continuous grid laterally delimiting a plurality of islands 109 of substrate 101. In this example, each island 109 is entirely surrounded and laterally separated from the neighboring islands 109 by trenches 107. As an example, in top view (FIG. 1B), trenches 107 comprise horizontal trenches and vertical trenches, regularly distributed all over the sensor surface. Islands 109 then all have substantially the same square or rectangular shape (in top view) and the same dimensions. Each island 109 for example has a width in the range from 2 to 10 μm. In this example, each pixel PIX comprises a single island 109.

The lateral walls and the bottom of trenches 107 are coated with an N-type semiconductor layer 113 (N). Layer 113 is for example made of doped poly silicon. In this example, the doping level of layer 113 is greater than the doping level of layer 103. Layer 113 for example extends all along the height and all along the length of the lateral walls of trenches 107. Layer 113 is in contact with the lateral surfaces of each substrate island 109, for example, all along the height and all along the periphery of island 109. During the manufacturing, the structure is submitted to a diffusion anneal resulting in diffusing dopant elements of layer 113 into substrate 101, for example over a distance in the range from 200 nm to 1 μm.

In this example, sensor 100 comprises, in an upper portion of each island 109, an N-type ring-shaped peripheral region 111 (N-). The doping level of region 111 is lower than that of layer 113. In top view, region 111 extends over the entire periphery of the island. Vertically, region 111 extends from the upper surface of substrate 101 and down to a depth smaller than that of the substrate, for example, a depth in the range from 100 to 1,500 nm. Laterally, region 111 extends from the edge of trench 107 delimiting island 109, towards the center of the island. The width of region 111 is smaller than the total width of the island, for example, in the range from 100 nm to 1,500 nm.

Each substrate island 109 defines a SPAD photodiode of a pixel PIX of the sensor. The anode region of the SPAD photodiode is formed by the P-type doped substrate portion 101 of the island. The cathode region of the SPAD photodiode comprises the portion of N-type layer 113 in contact with the lateral surfaces of island 109, the N-type region (not shown) diffused in a peripheral region of island 109 from layer 113, the N-type ring-shaped region 111 of the island, and the portion of N-type region 103 in contact with the lower surface of island 109. The PN junction formed between the lateral surfaces of island 109 and layer 113 defines the avalanche area of the SPAD photodiode, that is, the portion of the PN junction of the photodiode where the avalanche may be started by a single photogenerated charge.

In the upper portion of trenches 107, layer 113 is in contact with the outer lateral surfaces of N-type ring-shaped region 111. At this level, the PN junction of the photodiode thus corresponds to the interface between region 111 and substrate 101. Due to the fact that the N-type doping level of region 111 is lower than that of layer 113, the electric field generated at the level of the upper portion of the PN junction is less intense than the electric field generated at the level of the PN junction between substrate 101 and layer 113. Thus, region 111 enables to limit risks of spurious triggering of the photodiode due to edge effects at the upper end of trench 107. As a variation, region 111 may have a lateral doping level gradient, so that its N-type doping level progressively decreases as the distance to trench 107 increases.

In the lower portion of trenches 107, layer 113 is in contact with N-type layer 103. The lower portion of the PN junction of the photodiode thus corresponds to the interface between layer 103 and substrate 101. Here again, due to the fact that the N-type doping level of layer 103 is smaller than that of layer 113, the electric field generated at the level of the lower horizontal portion of the PN junction is less intense than the electric field generated at the level of the vertical PN junction between substrate 101 and layer 113. Thus, layer 103 enables to limit risks of spurious triggering of the photodiode linked to edge effects at the lower end of trenches 107.

The doping levels of substrate 101, of layers 113 and 103, and of regions 111 and the diode bias voltage are preferably selected so that the electric field at the level of the vertical PN junction formed between substrate 101 and layer 113 is sufficiently intense for the avalanche to be triggered by a single photogenerated charge, for example, is greater than 400 kV/cm over a distance from 100 to 500 nm along a direction orthogonal to the PN junction, and so that the electric field at the level of the PN junctions formed between substrate 101 and region 111 and between substrate 101 and layer 103 is sufficiently low for the avalanche not to be triggered by a single photogenerated charge, for example, is smaller than 400 kV/cm. As an example, the reverse breakdown voltage (or avalanche voltage) of the photodiode is in the range from 10 to 50 V, and the reverse bias voltage of the photodiode is greater than its breakdown voltage by a value in the range from 0.5 to 10 V. The doping level of substrate 101 is for example in the range from $5*10^{16}$ to $7*10^{17}$ atoms/cm$^3$. The doping level of layer 113 is for example in the range from $5*10^{18}$ to $1*10^{20}$ atoms/cm$^3$. The N-type doping level of region 111 and the doping level of layer 103 are for example between one third of the P-type doping level of substrate 101 and three times the P-type doping level of substrate 101. As an example, the N-type doping level of region 111 and of layer 103 are substantially equal to the P-type doping level of substrate 101.

As a variant, layer 103 may have a doping level substantially identical to that of layer 113. In this case, the avalanche area of each SPAD photodiode comprises not only the vertical PN junction formed between the lateral surfaces of substrate 101 and layer 113 but also the horizontal PN junction formed between substrate 101 and layer 103. This enables to increase the surface area of the avalanche area and thus the sensitivity of the photodiodes.

In the example of FIGS. 1A and 1B, the thickness of layer 113 is smaller than half the width of trenches 107, so that layer 113 does not entirely fill trenches 107. A conductive region 115, for example, metallic, is arranged in a central regions of the trenches unoccupied by layer 113. Region 115 is in contact, by its lateral surfaces, with the surfaces of layer 113 opposite to substrate islands 109 and, by its lower portion, with the lower surface of the portion of layer 113 coating the bottom of trenches 107. Region 115 extends along substantially the entire height and along the entire length of trenches 107.

Region 115 forms a continuous conductive grid electrically connecting to one another the cathode regions of all the sensor pixels.

Each pixel PIX may comprise an anode contact metallization 117 arranged above the upper surface of island 109 of substrate 101 of the pixel and electrically coupled to substrate 101. In the shown example, a local P-type doped contacting area 119, having a higher doping level than the substrate, extends in an upper central portion of island 109. Metallization 117 is arranged on top of and in contact with contacting region 119. Anode contact metallizations 117 enable to individually control the SPAD photodiodes of the different sensor pixels. Region 119 forms an area of collection of a signal representative of the pixel illumination.

The sensor may further comprise one or a plurality of cathode contact metallizations 121 arranged on top of and in contact with the upper surface of common conductive region 115. Due to the electric continuity of conductive region 115, the number of contact metallizations 121 may be smaller than the number of sensor pixels PIX.

For clarity, anode and cathode contact metallizations 117 and 121 have not been shown in FIG. 1B.

In operation, the cathode regions of the SPAD photodiodes of the sensor are biased to a positive potential V+, for example, via cathode contact metallizations 121, and the anode regions of the SPAD photodiodes of the sensor are biased to a negative potential V-, for example, via contact metallizations 117, so that the cathode-anode voltage of each photodiode is greater than its avalanche voltage.

The sensor is for example intended to be back-side illuminated. As an example, the sensor may comprise an integrated control circuit, not shown, arranged against it on the upper surface side of substrate 101 and electrically connected to metallizations 117 and 121. It should be noted that in the case where the sensor is intended to be back-side illuminated, a thinning, or even a total removal of lower layer 105 may possibly be provided. As an example, lower layer 105 is totally removed, and layer 103 is partially removed down to layer 113, or even down to the lower surface of regions 115. The lower surface of the sensor may further be coated with a stack of one or a plurality of dielectric layers, not shown, for example, a silicon nitride layer, enabling to favor the penetration of light into the SPAD photodiodes.

In addition to its cathode contact function, conductive region 115 forms an optical shield opaque to the radiation to be detected. This enables to limit risks of spurious triggering of the SPAD photodiodes of the sensor. Indeed, when a SPAD photodiode avalanches, the avalanche area emits photons. Region 115 forms an optical separation enabling to avoid for the photons to cause an avalanche in another photodiode of the sensor.

As an example, region 115 comprises a copper layer, and may further comprise a titanium nitride barrier layer forming an interface between the copper layer and layers 113 and 103 to avoid a diffusion of copper in layer 113 and 103. As a variant, region 115 comprises tungsten. More generally, any metal capable of fulfilling the double function of electric cathode contact and of optical separation of the SPAD photodiodes may be used to form region 115.

As an example, trenches 107 have a width in the range from 0.4 to 2 μm. Layer 113 for example has a thickness in the range from 0.1 to 0.8 µm. The thickness of conductive region 115 is for example in the range from 0.2 to 1 µm.

Figure 2:
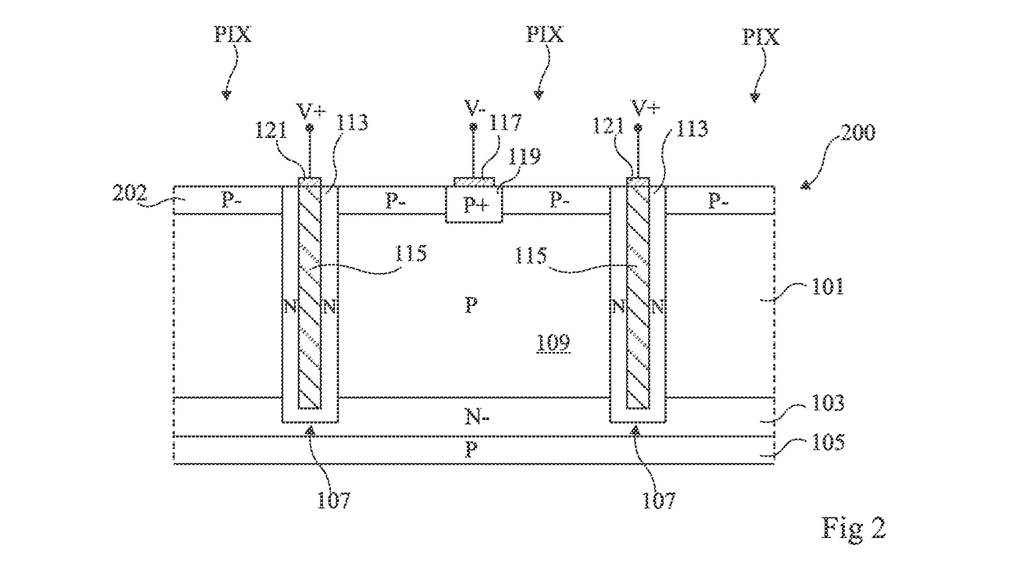
FIG. 2 is a cross-section view illustrating another example of an image sensor according to an embodiment.

FIG. 2 is a cross-section view schematically and partially illustrating another example of an image sensor 200 according to an embodiment.

The sensor 200 of FIG. 2 differs from the sensor 100 of FIG. 1 in that it does not comprise the N-type ring-shaped regions 111 of sensor 100. Further, in sensor 200, substrate 101 is topped with a P-type doped layer 202 (P−), having a doping level lower than that of the substrate, and having its lower surface in contact with the upper surface of the substrate. As an example, the thickness of layer 202 is in the range from 50 nm to 1.5 µm. Layer 202 is for example formed by epitaxy on the upper surface of substrate 101.

In the example of FIG. 2, trenches 107 extend vertically from the upper surface of layer 202, all the way to layer 103. Thus, at the level of the upper portion of trenches 107, in each pixel PIX, layer 113 is in contact with the lateral surfaces of the portion of layer 202 topping island 109 of the pixel. At this level, the PN junction of the photodiode thus corresponds to the interface between layer 202 and layer 113. Due to the fact that the P-type doping level of layer 202 is smaller than that of substrate 101, the electric field generated at the level of the PN junction between layer 202 and layer 113 is less intense than the electric field generated at the level of the PN junction between substrate 101 and layer 113. Thus, layer 202 enables to limit risks of spurious triggering of the photodiode linked to edge effects at the upper end of trenches 107. Preferably, the doping level of layer 202 is selected so that the electric field at the level of the PN junction between layer 202 and layer 113 is sufficiently low for the avalanche to be able to be started by a single photogenerated charge, for example, is lower than 400 kV/cm. As an example, the doping level of layer 202 is lower than $8*10^{16}$ atoms/cm$^3$.

In the example of FIG. 2, in each pixel PIX of the sensor, contacting region 119 is located opposite a central region of island 109 of the pixel and vertically extends from the upper surface of layer 202 to substrate 101.

Figure 3:
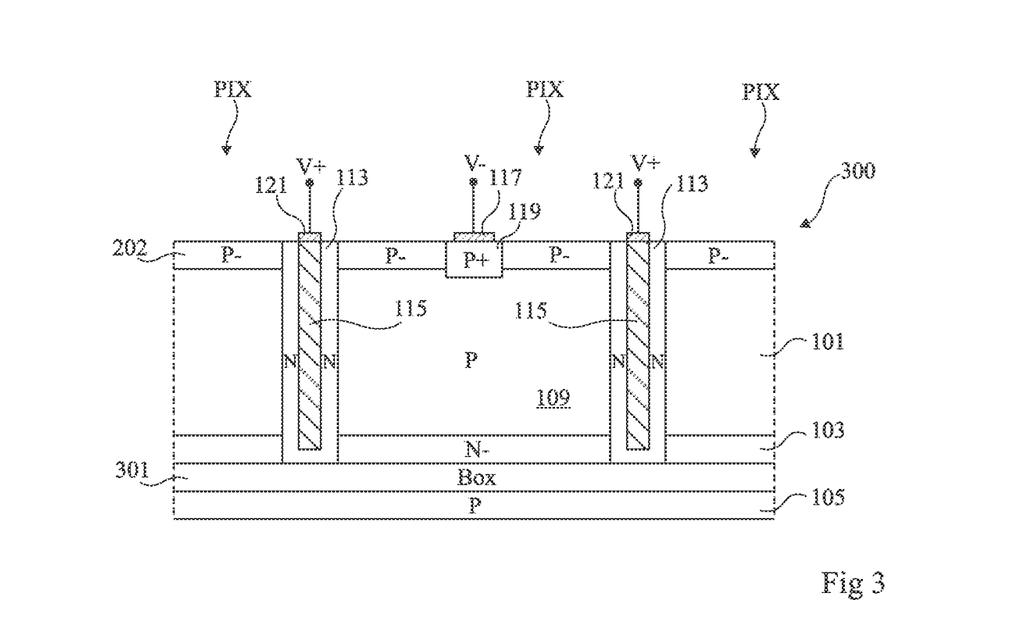
FIG. 3 is a cross-section view illustrating another example of an image sensor according to an embodiment.

FIG. 3 is a cross-section view schematically and partially illustrating another example of an image sensor 300 according to an embodiment. Sensor 300 of FIG. 3 has elements common with the sensor 200 of FIG. 2. The common elements are not detailed again. Hereafter, only the differences with respect to the sensor 200 of FIG. 2 will be detailed.

In the example of FIG. 3, the sensor is formed from a silicon on insulator substrate (SOI). Layer 105 corresponds to the support substrate of the SOI stack. An insulating layer 301 ("Box"), for example, made of silicon oxide, is arranged on top of and in contact with the upper surface of layer 105. Insulating layer 301 is itself topped with the stack of layers 103, 101, and 202.

In the example of FIG. 3, trenches 107 emerge onto the upper surface of insulating layer 301.

In the case where the sensor is intended to be back-side illuminated, a thinning or even a total removal of lower layer 105 may possibly be provided.

It should be noted that the variant of FIG. 3 may be adapted to the embodiment of FIGS. 1A and 1B.

Figure 4A:
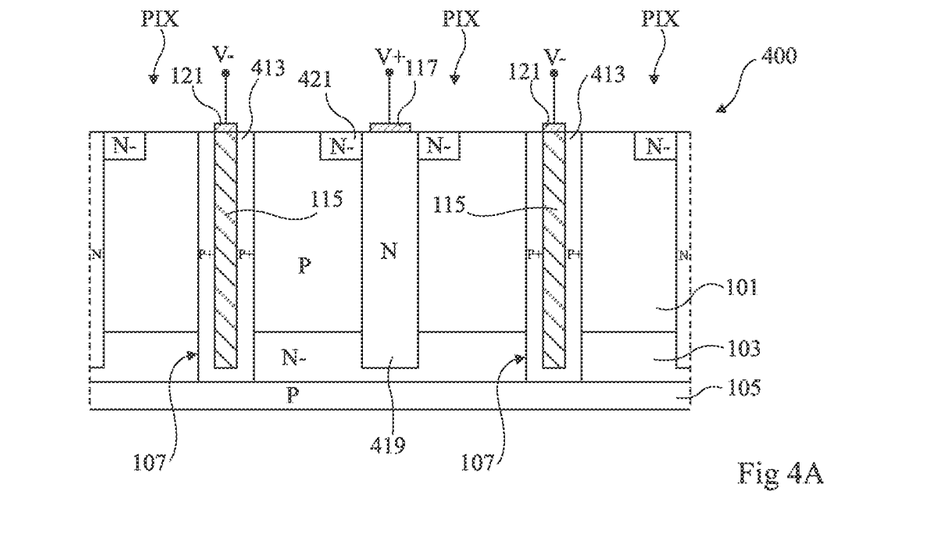
FIG. 4A is a cross-section view illustrating another example of an image sensor according to an embodiment.
Figure 4B:
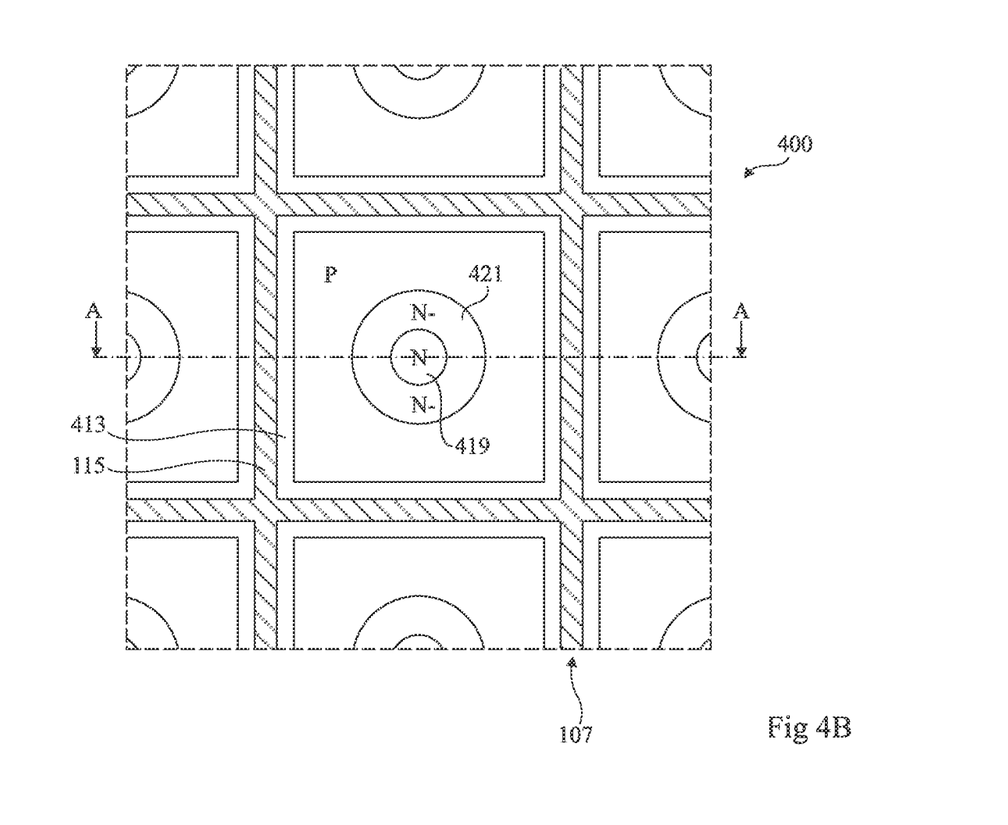
FIG. 4B is a top view of the sensor of FIG. 4A.

FIGS. 4A and 4B schematically and partially show an example of an image sensor 400 according to another embodiment. FIG. 4B is a top view of the sensor and FIG. 4A is a cross-section view along plane A-A of FIG. 4B.

The sensor 400 of FIGS. 4A and 4B comprises elements common with the sensor 100 of FIGS. 1A and 1B. The common elements will thus not be described again. Hereafter, only the differences between the two sensors will be detailed.

The sensor 400 of FIGS. 4A and 4B differs from the sensor 100 of FIGS. 1A and 1B in that, in sensor 400, the N-type layer 113 of sensor 100 is replaced with a P-type doped layer 413 (P+), having a doping level higher than that of substrate 101. Layer 413 is for example made of doped polysilicon. During the manufacturing, the structure may be submitted to a diffusion anneal resulting in diffusing dopant elements of layer 413 in substrate 101, for example, over a distance in the range from 200 nm to 1 µm.

Further, in the sensor 400 of FIGS. 4A and 4B, trenches 107 thoroughly cross layer 103 and emerge into or onto the upper surface of layer 105.

The sensor 400 of FIGS. 4A and 4B further differs from the sensor 100 of FIGS. 1A and 1B in that it does not comprise the N-type ring-shaped regions 111 present in sensor 100.

The sensor 400 of FIGS. 4A and 4B further comprises, in a central portion of each substrate island 109, an N-type doped region 419 vertically extending from the upper surface of substrate 101 to layer 103. In top view, the center of region 419 for example coincides with the center of island 109. The described embodiments are however not limited to this specific case. Region 419 is for example made of doped polysilicon. In this example, the doping level of region 419 is higher than the doping level of layer 103. During the manufacturing, the structure may be submitted to a diffusion anneal resulting in diffusing dopant elements from region 419 into substrate 101. Region 419 for example has the shape of a vertical stem or of a vertical bar with a circular cross-section. Regions 419 are for example formed before trenches 107.

Sensor 400 further comprises, in an upper portion of each island 109, an N-type ring-shaped region 421 (N−) totally surrounding, in top view, region 419. The doping level of region 421 is lower than that of region 419. Region 421 extends laterally from the edge of region 419, towards the periphery of island 109, and stops before reaching trenches 107. The width of region 421 is for example in the range from 100 nm to 1,500 nm. Vertically, region 421 extends from the upper surface of substrate 101 down to a depth smaller than that of the substrate, for example, a depth in the range from 100 to 1,500 nm.

Each substrate island 109 defines a SPAD photodiode of a pixel PIX of the sensor. The anode region of the SPAD photodiode is formed by layer 413 and by the P-type doped portion of substrate 101 of the island. The cathode region of the SPAD photodiode comprises N-type central region 419, central ring-shaped region 421, and the portion of N-type layer 103 in contact with the lower surface of island 109. The PN junction formed between the lateral surfaces of region 419 and substrate 101 defines the avalanche area of the SPAD photodiode, that is, the portion of the PN junction of the photodiode where the avalanche may be triggered by a single photogenerated charge.

In the upper portion of region 419, the lateral surfaces of region 419 are in contact with ring-shaped region 421. At this level, the PN junction of the photodiode thus corresponds to the interface between region 421 and substrate 101. Due to the fact that the N-type doping level of region 421 is lower than that of region 419, the electric field generated at the level of the upper portion of the PN junction is less intense than the electric field generated at the level of the PN junction between substrate 101 and region 419. Thus, region 421 enables to limit risks of spurious triggering of the photodiode due to edge effects at the upper end of region 419.

In the lower portion of region 419, region 419 is in contact with N-type layer 103. The lower portion of the PN junction of the photodiode thus corresponds to the interface between layer 103 and substrate 101. Here again, due to the fact that the N-type doping level of layer 103 is lower than that of region 419, the electric field generated at the level of the lower horizontal portion of the PN junction is less intense than the electric field generated at the level of the vertical PN junction between substrate 101 and region 419. Thus, layer 103 enables to limit risks of spurious triggering of the photodiode linked to edge effects at the lower end of region 419.

The doping levels of substrate 101, of regions 419 and 421, and of layer 103, and the photodiode bias voltage are preferably selected so that the electric field at the level of the vertical PN junction formed between substrate 101 and region 419 is sufficiently intense for the avalanche to be triggered by a single photogenerated charge, for example, is greater than 400 kV/cm over a distance from 100 to 500 nm along a direction orthogonal to the PN junction, and so that the electric field at the level of the PN junctions formed between substrate 101 and region 421 and between substrate 101 and layer 103 is sufficiently low for the avalanche not to be triggered by a single photogenerated charge, for example, is smaller than 400 kV/cm.

Region 115 forms a continuous conductive grid electrically connecting to one another the anode regions of all the sensor pixels.

Each pixel PIX may comprise a cathode contact metallization 117 arranged on top of and in contact with the upper surface of region 419. To favor the contact, region 419 may comprise, in the vicinity of its upper surface, a more heavily-doped area (not detailed in the drawing) in contact with metallization 117. Cathode contact metallizations 117 enable to individually control the SPAD photodiodes of the different sensor pixels. Region 419 defines an area of collection of a signal representative of the illumination of the pixel.

The sensor may further comprise one or a plurality of anode contact metallizations 121 arranged on top of and in contact with the upper surface of common conductive region 115. Due to the electric continuity of conductive region 115, the number of cathode contact metallizations 121 may be smaller than the number of sensor pixels PIX.

For clarity, anode and cathode contact metallizations 121 and 117 have not been shown in FIG. 4B.

In operation, the cathode regions of the SPAD photodiodes of the sensor are biased to a positive potential V+, for example, via cathode contact metallizations 117, and the anode regions of the SPAD photodiodes of the sensor are biased to a negative potential V−, for example, via contact metallizations 121, so that the cathode-anode voltage of each photodiode is greater than its avalanche voltage.

In addition to its anode contact function, conductive region 115 forms an optical shield opaque to the radiation to be detected. This enables to limit risks of spurious triggering of the SPAD photodiodes of the sensor.

In the case where the sensor is intended to be back-side illuminated, a thinning or even a total removal of lower layer 105 may possibly be provided. As a variant, before the thinning, trenches 107 emerge at an intermediate level of layer 103 but do not thoroughly cross layer 103, and, during the back side thinning, layer 105 is totally removed and layer 103 is partially removed down to layer 413, or even down to the lower surface of regions 115.

It should be noted that the embodiment of FIGS. 4A and 4B may be adapted to the embodiment of FIG. 2. In this case, ring-shaped region 421 may be omitted and replaced with P-type layer 202. Further, the embodiment of FIGS. 4A and 4B may be adapted to the embodiment of FIG. 3.

Various embodiments and variants have been described. Those skilled in the art will understand that certain features of these various embodiments and variants may be combined, and other variants will occur to those skilled in the art. In particular, the described embodiments are not limited to the numerical examples of dimensions and of doping levels mentioned in the disclosure.

Further, all the conductivity types of the above-described structures may be inverted, the cathode regions being then replaced with anode regions, and conversely.

What is claimed is:

1. An image sensor comprising a plurality of avalanche photodiodes with a vertical PN junction formed inside and on top of a semiconductor substrate of a first conductivity type having a front side and a back side, wherein:
   trenches vertically extend in the substrate from its front side to its back side, the trenches having, in top view, the shape of a continuous grid laterally delimiting a plurality of substrate islands, each island defining a pixel comprising a single individually-controllable avalanche photodiode with a vertical PN junction, and comprising a doped area of collection of an avalanche signal of the pixel photodiode;
   the lateral walls of the trenches are coated with a first semiconductor layer having a conductivity type opposite to that of the collection area; and
   a conductive region extends in the trenches, said conductive region being in contact with the surface of the first semiconductor layer opposite to the substrate,
   the sensor further comprising, in a central portion of each substrate island, a central region having a conductivity type opposite to that of the substrate forming the collection area of the island, vertically extending in the substrate from its front side to its back side, the junction between the lateral surfaces of the central region having a conductivity type opposite to that of the substrate and the substrate defining an avalanche area of an avalanche photodiode of the sensor.

2. The sensor according to claim 1, wherein the first semiconductor layer is of the first conductivity type.

3. The sensor according to claim 1, further comprising, in an upper portion of each substrate island, a ring-shaped region having a conductivity opposite to that of the substrate and a doping level lower than that of the central region having a conductivity opposite to that of the substrate, laterally extending from the lateral walls of the central region having a conductivity opposite to that of the substrate.

4. The sensor according to claim 1, wherein the collection areas of the different pixels are electrically insulated from one another.

5. The sensor according to claim 1, wherein the conductive region is opaque to the radiation to be detected.

6. The method according to claim 1, wherein the conductive region is made of metal.

7. The sensor according to claim 6, wherein the conductive region comprises copper or tungsten.

8. The sensor according to claim 1, wherein the first semiconductor layer is made of doped polysilicon.

9. The sensor according to claim 1, wherein the substrate rests, on its back side, on a third semiconductor layer having a conductivity type opposite to that of the substrate, the trenches emerging into or onto the third layer or crossing the third layer.

10. The sensor according to claim 9, wherein the doping level of the third layer is lower than that of the first layer.

* * * * *